(12) United States Patent
Sivakumar et al.

(10) Patent No.: US 11,294,413 B2
(45) Date of Patent: Apr. 5, 2022

(54) APPARATUS AND METHOD FOR GENERATING REFERENCE DC VOLTAGE FROM BANDGAP-BASED VOLTAGE ON DATA SIGNAL TRANSMISSION LINE

(71) Applicant: QUALCOMM Incorporated, San Diego, CA (US)

(72) Inventors: Balasubramanian Sivakumar, San Diego, CA (US); Dinesh Jagannath Alladi, San Diego, CA (US); Kentaro Yamamoto, San Diego, CA (US); Sean Baker, San Diego, CA (US); Liang Zhao, Saratoga, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 15 days.

(21) Appl. No.: 16/835,494

(22) Filed: Mar. 31, 2020

(65) Prior Publication Data

US 2020/0333819 A1 Oct. 22, 2020

Related U.S. Application Data

(62) Division of application No. 16/388,664, filed on Apr. 18, 2019, now Pat. No. 10,642,302.

(51) Int. Cl.
*G05F 3/08* (2006.01)
*H04B 1/16* (2006.01)

(52) U.S. Cl.
CPC . *G05F 3/08* (2013.01); *H04B 1/16* (2013.01)

(58) Field of Classification Search
CPC .... G05F 3/08; H04B 1/16; H04B 1/18; H04B 3/00; H04L 25/0272; H04L 25/0292;
(Continued)

(56) References Cited

U.S. PATENT DOCUMENTS 8,324,881 B2  12/2012  Trifonov et al.
9,671,811 B2   6/2017  Sim et al.
(Continued)

FOREIGN PATENT DOCUMENTS

WO    2017172344 A1    10/2017

OTHER PUBLICATIONS

International Search Report and Written Opinion—PCT/US2020/023061—ISA/EPO—dated Jun. 15, 2020.

*Primary Examiner* — Sibin Chen
(74) *Attorney, Agent, or Firm* — Loza & Loza, LLP

(57) ABSTRACT

An apparatus for generating a substantially constant DC reference voltage. The apparatus includes a reference voltage generator configured to generate a substantially constant direct current (DC) reference voltage based on a voltage on a data signal transmission line, wherein the voltage is based on a bandgap reference voltage. In one implementation, the data signal transmission line is a differential signal transmission line and the voltage is a common mode voltage. In another implementation, the data signal transmission line is an I-data signal transmission line and a Q-data signal transmission line, and the voltage is an average or weighted-average of the common mode voltages of the I- and Q-differential signals. In another implementation, the reference voltage is based on a single-ended (e.g., positive- and/or negative-)component or vice-versa of I- and Q-data signals, respectively.

13 Claims, 9 Drawing Sheets

(58) Field of Classification Search
CPC .............. H04L 25/028; H04L 25/0276; H03K 19/018564; H03K 19/01855
See application file for complete search history.

(56) References Cited

U.S. PATENT DOCUMENTS

| | | |
|---|---|---|
| 9,891,650 B2 | 2/2018 | Motozawa et al. |
| 10,642,302 B1 | 5/2020 | Sivakumar et al. |
| 2003/0085736 A1 | 5/2003 | Tinsley et al. |
| 2005/0118976 A1* | 6/2005 | Murakami ............... H04B 1/30 455/313 |
| 2006/0006958 A1* | 1/2006 | Ziegler ............... H04L 25/0272 333/100 |
| 2007/0264947 A1 | 11/2007 | Rozenblit et al. |
| 2010/0188140 A1 | 7/2010 | Smeloy |
| 2010/0327962 A1 | 12/2010 | Lee |
| 2013/0120020 A1 | 5/2013 | Li et al. |
| 2013/0182797 A1* | 7/2013 | Liu ........................ H04L 27/06 375/320 |
| 2018/0292849 A1 | 10/2018 | Krishnan et al. |

* cited by examiner

APPARATUS AND METHOD FOR GENERATING REFERENCE DC VOLTAGE FROM BANDGAP-BASED VOLTAGE ON DATA SIGNAL TRANSMISSION LINE

CLAIM OF PRIORITY

The present application for Patent is a Divisional of application Ser. No. 16/388,664 entitled "APPARATUS AND METHOD FOR GENERATING REFERENCE DC VOLTAGE FROM BANDGAP-BASED VOLTAGE ON DATA SIGNAL TRANSMISSION LINE" filed Apr. 18, 2019, and assigned to the assignee hereof and hereby expressly incorporated by reference herein.

FIELD

Aspects of the present disclosure relate generally to generating a substantially constant direct current (DC) reference voltage, and in particular, to an apparatus and method for generating a reference direct current (DC) voltage based on a bandgap-based voltage on one or more data signal transmission lines.

BACKGROUND

A bandgap reference circuit is a commonly used circuit to generate a substantially constant, direct current (DC) reference voltage used by one or more other circuits. The reference voltage generated by a bandgap reference circuit is also substantially temperature-independent, and also substantially independent of supply voltage variation. The reference voltage is usually buffered to provide a low impedance output from which one or more other circuits may draw current.

There are several drawbacks with bandgap reference circuits. First, they require a relatively high supply voltage, e.g., higher than digital or memory circuits typically require. Thus, in many situations, a bandgap reference circuit sets the highest supply voltage required by an integrated circuit (IC or "chip"). Second, routing the supply voltage for the bandgap reference circuit usually requires one or more power pins and significant multi-level routing, which often leads to routing congestion and signal crosstalk. Third, a bandgap reference circuit typically occupies a substantial amount of IC footprint.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a reference voltage generator configured to generate a substantially constant, direct current (DC) reference voltage based on a voltage on a data signal transmission line, wherein the voltage is based on a bandgap reference voltage.

Another aspect of the disclosure relates to a method including receiving a voltage on a data signal transmission line, the voltage being based on a bandgap reference voltage; and generating a substantially constant, DC reference voltage based on the voltage.

Another aspect of the disclosure relates to an apparatus including means for receiving a voltage on a data signal transmission line, the voltage being based on a bandgap reference voltage; and means for generating a substantially constant direct current (DC) reference voltage based on the voltage.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
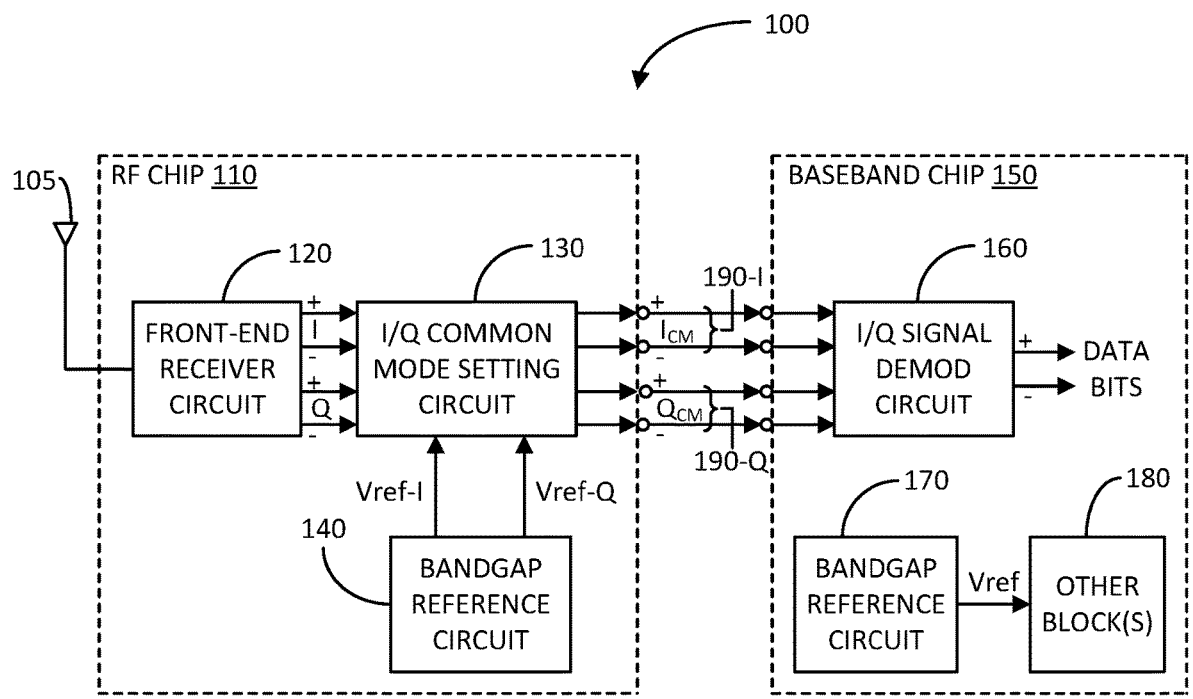
FIG. 1 illustrates a block diagram of an exemplary multiple-integrated circuit ("chip") apparatus in accordance with an aspect of the disclosure.

FIG. 1 illustrates a block diagram of an exemplary multiple-integrated circuit ("chip") apparatus 100 in accordance with an aspect of the disclosure. In this example, the apparatus includes a radio frequency (RF) chip 110 and a baseband chip 150. It shall be understood that, in the context of this disclosure, the nature of the two or more chips is not important and need not be limited to an RF chip and/or a baseband chip, but can encompass different types of integrated circuits or chips.

The RF chip 110 includes a front-end receiver circuit 120 coupled to at least one antenna 105, an I/Q common mode voltage setting circuit 130, and a bandgap reference circuit 140. The front-end receiver circuit 120 receives a signal from the at least one antenna 105, and generates I- and Q-signals. The front-end receiver circuit 120 may include a low noise amplifier (LNA), I- and Q-downconverters, and/or other related circuitry for generating the I- and Q-data signals.

The I/Q common mode setting circuit 130 receives the I- and Q-data signals from the front-end receiver circuit 120, which may be differential signals in this example. The I/Q common mode setting circuit 130 separately sets the common mode voltages of the I- and Q-differential data signals to generate common-mode-set $I_{CM}$- and $Q_{CM}$-differential data signals.

The bandgap reference circuit 140 generates bandgap reference voltages Vref-I and Vref-Q for the I/Q common mode setting circuit 130. The common mode setting circuit 130 uses the bandgap references voltages Vref-I and Vref-Q to set the common mode voltages for the $I_{CM}$- and $Q_{CM}$-differential data signals. Since the common mode voltages of the $I_{CM}$- and $Q_{CM}$-differential signals are based on bandgap reference voltages Vref-I and Vref-Q, the common mode voltages have substantially the same stability with respect to temperature and supply voltage variations as the bandgap reference voltages.

The differential signals $I_{CM}$- and $Q_{CM}$-differential data signals are then transmitted from the RF chip 110 to the baseband chip 150 via a pair of differential data signal transmission lines 190-I and 190-Q, respectively. The differential data signal transmission lines 190-I and 190-Q may be formed on and/or within a printed circuit board (PCB). The RF chip 110 and the baseband chip 150 may be mounted on the PCB.

The baseband chip 150 includes an I/Q signal demodulator circuit 160 configured to receive the $I_{CM}$- and $Q_{CM}$-differential data signals from the RF chip 110 via the differential data signal transmission lines 190-I and 190-Q, and demodulate the $I_{CM}$- and $Q_{CM}$-differential data signals to generate data bits. The baseband chip 150 may also include a bandgap reference circuit 170 for generating at least one bandgap reference voltage Vref for at least one other circuit block 180.

Thus, in the exemplary apparatus 100, the RF chip 110 includes a bandgap reference circuit 140 and the baseband chip 150 also includes a bandgap reference circuit 170. However, as discussed in the Background section, having a chip employ a bandgap reference circuit comes with a penalty. As discussed, the bandgap reference circuit typically requires a relatively high supply voltage, pins and routing to route the high supply voltage and Vss or ground to the bandgap reference circuit resulting in increased routing congestion and crosstalk, and typically occupies a relatively large IC footprint.

Figure 2:
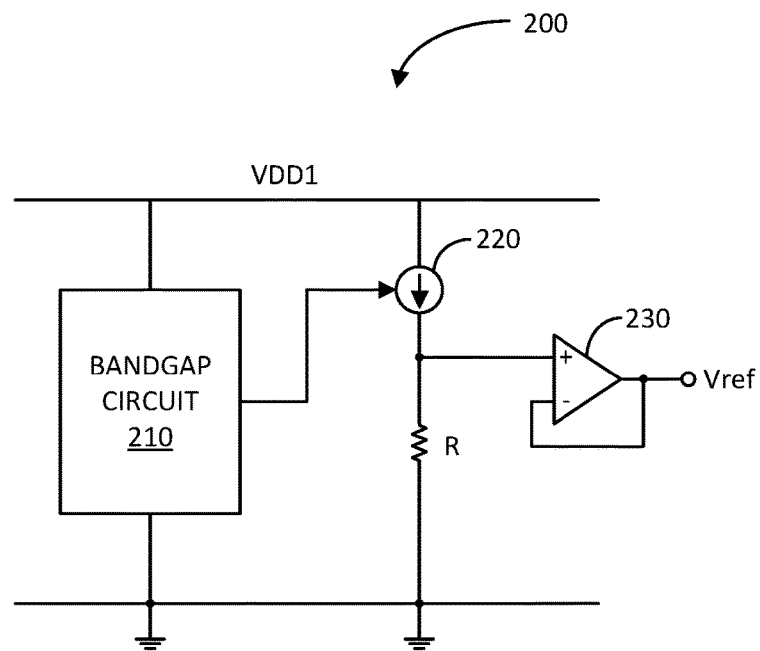
FIG. 2 illustrates a block diagram of an exemplary bandgap reference voltage generator in accordance with another aspect of the disclosure.

FIG. 2 illustrates a block diagram of an exemplary bandgap reference voltage generator 200 in accordance with another aspect of the disclosure. The bandgap reference voltage generator 200 includes a bandgap circuit 210 configured to generate a proportional to absolute temperature (PTAT) current and a complementary to absolute temperature (CTAT) current. The PTAT and CTAT currents are summed to generate a current that is substantially constant with temperature and supply voltage (VDD1) variation.

The stable current is then mirrored using a current source 220 coupled in series with a resistor R between the upper voltage rail VDD1 and ground. The stable current generates a similarly stable voltage across the resistor R. The stable voltage across the resistor R is buffered by a buffer 230, which generates the bandgap reference voltage Vref, while providing a low impedance output from which one or more other circuit blocks may draw current.

As mentioned above, the supply voltage VDD1 for the bandgap reference voltage generator 200 is typically higher than other supply voltages in an IC, such as a supply voltage for powering digital circuitry or memory. In many cases, the supply voltage VDD1 for the bandgap reference voltage generator 200 dictates the highest supply voltage for an IC. Further, as discussed above, there are additional drawbacks resulting from the high supply voltage, such as one or more additional IC pins, routing, congestion, and crosstalk, plus the bandgap reference voltage generator typically occupies a relatively large IC footprint.

Figure 3:
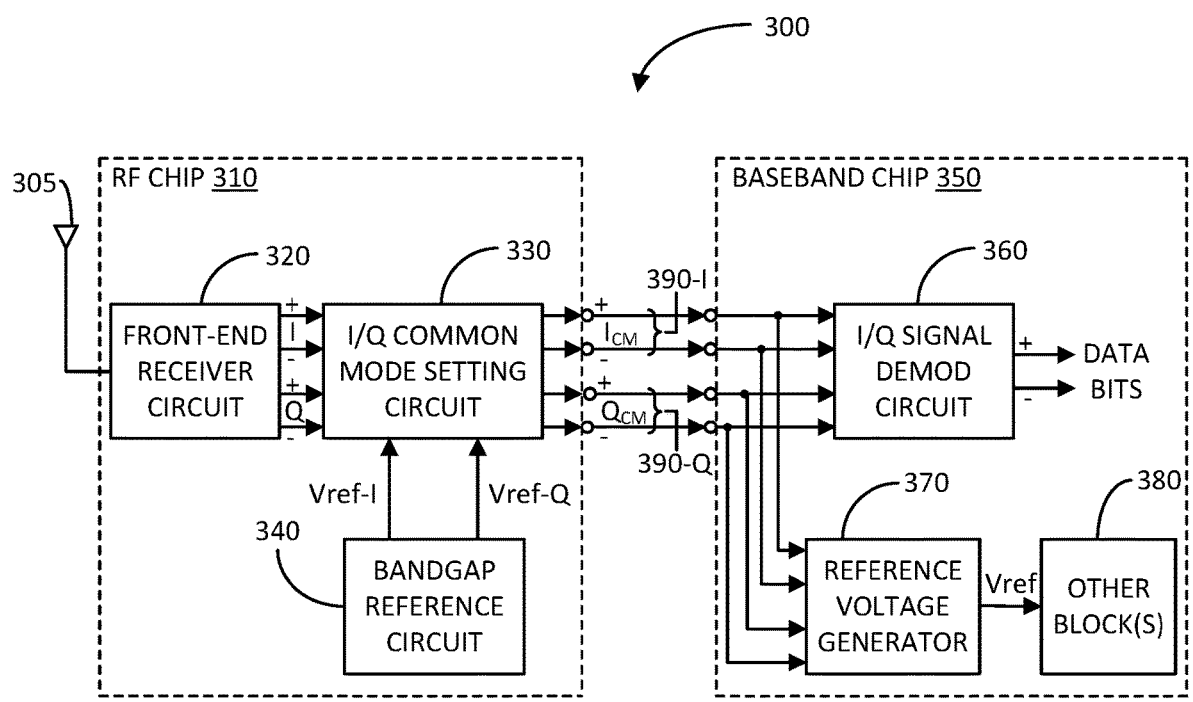
FIG. 3 illustrates a block diagram of another exemplary multiple-chip apparatus in accordance with another aspect of the disclosure.

FIG. 3 illustrates a block diagram of an exemplary multiple-integrated circuit ("chip") apparatus 300 in accordance with another aspect of the disclosure. In summary, the apparatus 300 includes a baseband chip having a reference voltage generator configured to generate a DC reference voltage Vref from one or both the $I_{CM}$- and $Q_{CM}$-data signals or one or more components thereof. Since, as discussed with apparatus 100, the common mode voltages of the $I_{CM}$- and $Q_{CM}$-data signals are based on bandgap reference voltages Vref-I and Vref-Q, the DC reference voltage Vref generated by the reference voltage generator may have substantially the same stability with regard to temperature and supply voltage variation as the bandgap reference voltages. Thus, there is no need for the baseband chip to include a bandgap reference circuit.

In particular, the apparatus 300 includes an RF chip 310 and a baseband chip 350. As in apparatus 100, although an RF chip 310 and baseband chip 350 are used to exemplify the concepts herein, it shall be understood that the chips may be of any type. The RF chip 310 is similar to RF chip 110 with reference numbers being the same to identify the same elements with the exception that the most significant digit (MSD) in apparatus 300 is a "3" instead of a "1". Accordingly, the front-end receiver circuit 320 coupled to the antenna 305, the I/Q common mode setting circuit 330, and the bandgap reference circuit 340 have been discussed in detail with reference to apparatus 100.

The baseband chip 350 includes an I/Q signal demodulator circuit 350, a reference voltage generator 370, and one or more circuit blocks 380. The I/Q signal demodulator circuit 350 receives the $I_{CM}$- and $Q_{CM}$-differential data signals from the RF chip 310 via differential data signal transmission lines 390-I and 390-Q, respectively. As discussed, the differential data signal transmission lines 390-I and 390-Q may be formed on and/or within a PCB, on which, the RF chip 310 and the baseband chip 350 may be mounted. The I/Q signal demodulator circuit 350 processes the $I_{CM}$- and $Q_{CM}$-differential data signals to generate data bits.

The reference voltage generator 370 also receives one or both of the $I_{CM}$- and $Q_{CM}$-differential data signals or components thereof, and generates a DC reference voltage Vref based on the $I_{CM}$- and $Q_{CM}$-differential data signals. Since the common mode voltages of the $I_{CM}$- and $Q_{CM}$-differential data signals are based on bandgap reference voltages Vref-I and Vref-Q, the DC reference voltage Vref generated by the reference voltage generator 370 may also have substantially the same stability with respect to temperature and supply voltage variation as the bandgap reference voltages. As in apparatus 100, the DC reference voltage Vref is provided to one or more circuit blocks 380 for use in performing their intended operations.

As discussed below in more detail, in one exemplary implementation, the reference voltage generator 370 includes circuitry to extract the common mode voltages from the $I_{CM}$- and $Q_{CM}$-differential data signals, average the common mode voltages, and low pass filter the average voltage to generate a substantially constant DC voltage. Additionally, the reference voltage generator 370 includes a buffer to output the constant DC voltage as the reference voltage Vref. The buffer provides a low impedance output from which the one or more circuit blocks 380 can draw current.

In other exemplary implementations, the reference voltage generator 370 generates the reference voltage Vref based on: (1) only the $I_{CM}$-differential data signal; (2) only the $Q_{CM}$-differential data signal; (3) the positive and negative components of the $I_{CM}$- and $Q_{CM}$-differential data signals, respectively; and (4) the negative and positive components of the $I_{CM}$- and $Q_{CM}$-differential data signals, respectively.

Figure 4:
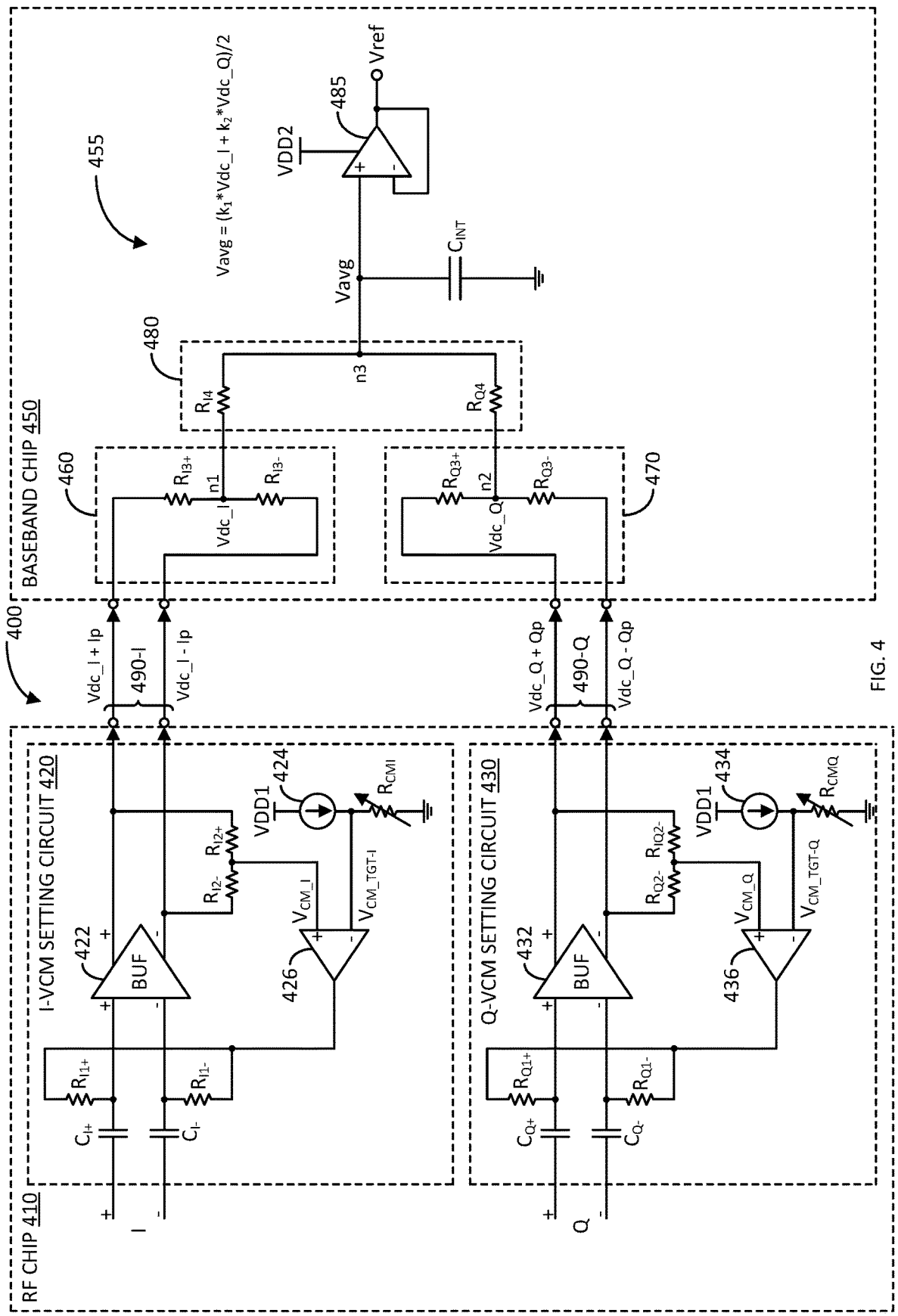
FIG. 4 illustrates a schematic diagram of another exemplary multiple-chip apparatus in accordance with another aspect of the disclosure.

FIG. 4 illustrates a schematic diagram of another exemplary multiple-chip apparatus 400 in accordance with another aspect of the disclosure. The apparatus 400 includes an RF chip 410 and a baseband chip 450. Again, with respect to the other apparatuses described herein, the RF chip 410 and baseband chip 450 are used to exemplify the concepts herein, and other types of chips may be used.

The RF chip 410 includes an I-data signal common mode voltage (I-VCM) setting circuit 420 and a Q-data signal common mode voltage (Q-VCM) setting circuit 430. The I-VCM setting circuit 420 includes capacitors $C_{I+}$ and $C_{I-}$, Resistors $R_{I1+}$ and $R_{I1-}$, a Buffer 422, resistors $R_{I2+}$ and $R_{I2-}$, differential amplifier 426, and a bandgap reference circuit including current source 424 and variable resistor $R_{CMI}$ coupled between an upper voltage rail VDD1 and a lower voltage rail (e.g., ground).

An I-differential data signal from a front-end receiver circuit (e.g., as discussed with apparatuses 100 and 300) is applied to a differential input of the buffer 422 via capacitors $C_{I+}$ and $C_{I-}$, respectively. The capacitors $C_{I+}$ and $C_{I-}$ are alternating current (AC) coupling capacitors having substantially the same capacitance. The buffer 422 includes a differential output configured to produce an output I-differential data signal Vdc_I±Ip, which includes a positive-component Vdc+Ip and a negative-component Vdc_I−Ip, and Vdc_I represents the common mode voltage of the signal.

The differential output of the buffer 422 is coupled to a positive input of the differential amplifier 426 via resistors $R_{I2+}$ and $R_{I2-}$, respectively. The resistors $R_{I2+}$ and $R_{I2-}$ have substantially the same resistance, and are configured to produce a measured common mode voltage $V_{CM\_I}$ of the output differential data signal Vdc_I±Ip at the positive input of the differential amplifier 426.

The I-VCM setting circuit 420 further includes a bandgap reference circuit including a bandgap current source 424 and variable resistor $R_{CMI}$ coupled between an upper voltage rail VDD1 and a lower voltage rail (e.g., ground). The bandgap reference circuit is configured to generate a target common mode voltage $V_{CM\_TGT\_I}$ for the output I-differential data signal Vdc_I±Ip. The target common mode voltage $V_{CM\_TGT\_I}$ is a bandgap reference voltage; and thus, it is substantially stable with temperature and supply voltage (VDD1) variation.

The differential amplifier 426 includes an output coupled to the differential input of the buffer 422 via resistors $R_{I1+}$ and $R_{I1-}$, respectively. Accordingly, the differential amplifier 426 generates an output signal based on a difference between the measured common mode voltage $V_{CM\_I}$ of the I-output differential data signal Vdc_I±Ip and the target common mode voltage $V_{CM\_TGT\_I}$. The output signal then changes the common mode voltage at the differential input of the buffer 422 via resistors $R_{I1+}$ and $R_{I1-}$, respectively. Thus, through feedback operation, the common mode voltage Vdc_I of the output differential signal Vdc_I±Ip is controlled to be at substantially the target common mode voltage $V_{CM\_TGT\_I}$, which a bandgap-based voltage.

The Q-VCM setting circuit 430 is configured similar to the I-VCM setting circuit 420 previously discussed. In summary, the Q-VCM setting circuit 430 includes capacitors $C_{Q+}$ and $C_{Q-}$, resistors $R_{Q1+}$ and $R_{Q1-}$, a buffer 432, resistors $R_{Q2+}$ and $R_{Q2-}$, differential amplifier 436, and a bandgap circuit including current source 434 and variable resistor $R_{CMQ}$ coupled between the upper voltage rail VDD1 and the lower voltage rail (e.g., ground).

An input Q-differential data signal from a front-end receiver circuit is applied to a differential input of the buffer 432 via capacitors $C_{Q+}$ and $C_{Q-}$, respectively. The buffer 432 includes a differential output configured to produce a Q-output differential data signal Vdc_Q±Qp, wherein Vdc_Q is the common mode voltage. The resistors $R_{Q2+}$ and $R_{Q2-}$ coupled to the differential output of the buffer 432, provides a measured common mode voltage $V_{CM\_Q}$ of the Q-output differential data signal Vdc_Q±Qp at the positive input of the differential amplifier 436. The bandgap circuit generates a target common mode voltage $V_{CM\_TGT\_Q}$ for the Q-output differential data signal Vdc_Q±Qp, which is a bandgap-based voltage and is substantially stable with temperature and supply voltage (VDD1) variation.

The differential amplifier 436 generates an output signal based on a difference between the measured common mode voltage $V_{CM\_Q}$ of the Q-output differential signal Vdc_Q±Qp and the target common mode voltage $V_{CM\_TGT\_Q}$. The output signal of the differential amplifier 436 is applied to the differential input of the buffer 432 via resistors $R_{Q2+}$ and $R_{Q2-}$, respectively. The output signal changes the common mode voltage at the differential input of the buffer 432, which causes a similar change in the common mode voltage Vdc_Q of the Q-output differential data signal Vdc_Q±Qp. Through feedback operation, the common mode voltage Vdc_Q of the Q-output differential signal Vdc_Q±Qp is controlled to be at substantially the target common mode voltage $V_{CM\_TGT\_Q}$, which is a bandgap-based voltage.

The baseband chip 450 includes a reference voltage generator 455. The reference voltage generator 455, in turn, includes an I-common mode voltage extracting circuit 460, and Q-common mode voltage extracting circuit 470, a voltage averaging circuit 480, an integrating capacitor $C_{INT}$, and a buffer 485.

The I-common mode voltage extracting circuit 460 includes resistors $R_{I3+}$ and $R_{I3-}$ including respective first terminals configured to receive the I-output differential data signal Vdc_I±Ip from the RF chip 410 via differential data signal transmission lines 490-I that may be formed on and/or within a PCB upon which the RF chip 410 and the baseband chip 450 are mounted. The resistors $R_{I3+}$ and $R_{I3-}$, having substantially the same resistance, include respective second terminals coupled together at a node n1, and configured to produce the extracted common mode voltage Vdc_I of the I-output differential data signal Vdc_I±Ip.

Similarly, the Q-common mode voltage extracting circuit 470 includes resistors $R_{Q3+}$ and $R_{Q3-}$ including respective first terminals configured to receive the Q-output differential data signal Vdc_Q±Qp from the RF chip 410 via differential data signal transmission lines 490-Q that may be formed on and/or within the PCB upon which the RF chip 410 and the baseband chip 450 are mounted. The resistors $R_{Q3+}$ and $R_{Q3-}$, having substantially the same resistance, include respective second terminals coupled together at a node n2, and configured to produce the extracted common mode voltage Vdc_Q of the Q-output differential data signal Vdc_Q±Qp.

The voltage averaging circuit 480 includes resistors $R_{I4}$ and $R_{Q4}$ including first terminals coupled to nodes n1 and n2, and configured to receive the extracted common mode voltages Vdc_I and Vdc_Q of the I- and Q-differential data signals, respectively. The resistors $R_{I4}$ and $R_{Q4}$, which may have substantially the same resistance (e.g., weights $k_1=k_2=1$), include respective second terminals coupled together at a node n3, and configured to produce an average (Vavg) of the common mode voltages Vdc_I and Vdc_Q (e.g., (Vdc_I+Vdc_Q)/2)). Note that averaging of the common mode voltages Vdc_I and Vdc_Q has an advantage of lowering the variation of the average voltage by a factor of a square root of two or 1.414 compared to the variation of the individual common mode voltages Vdc_I and Vdc_Q.

Also note that the resistances of the resistors $R_{I4}$ and $R_{Q4}$ need not be the same if a weighted-average of the common mode voltages Vdc_I and Vdc_Q is desired (e.g., $(k_1*Vdc\_I+k_2*Vdc\_Q)/2$), where $k_1=R_{Q4}/(R_{I4}+R_{Q4})$ and $k_2=R_{I4}/(R_{I4}+R_{Q4})$, and $R_{I4}$ and $R_{Q4}$ in the equations represent the resistances of resistors $R_{I4}$ and $R_{Q4}$, respectively). The weighted-average of the common mode voltages Vdc_I and Vdc_Q may be desirable if there is more variation of one common mode voltage over the other. For example, if there is more variation in the I-signal common mode voltage Vdc_I compared to the Q-signal common mode voltage Vdc_Q, then the weighted average should favor the Q-signal common mode voltage Vdc_Q (e.g., $k_2 > k_1$). On the other hand, if there is more variation in the Q-signal common mode voltage Vdc_Q compared to the I-signal common mode voltage Vdc_I, then the weighted average should favor the I-signal common mode voltage Vdc_I (e.g., $k_1 > k_2$).

The average or weighted-average common mode voltage Vavg is applied across a shunt integrating capacitor $C_{INT}$ coupled between node n3 and ground. The integrating capacitor $C_{INT}$ low pass filters the average voltage Vavg to remove substantially all AC components from the average voltage; thereby, resulting in a substantially constant DC voltage being applied to the positive input of the buffer 485. The buffer 485 buffers the DC voltage at its positive input to generate a substantially constant DC reference voltage Vref at its output.

Since the reference voltage Vref is based on the I- and Q-output differential data signals, which have common mode voltages Vdc_I and Vdc_Q set by bandgap reference voltages $V_{CM\_TGT-I}$ and $V_{CM\_TGT-Q}$, respectively, the reference voltage Vref has substantially the same stability with respect to temperature and supply voltage variation as the bandgap reference voltages. Thus, there is no need to provide a separate bandgap reference circuit in the baseband chip 450, which has the aforementioned drawbacks of requiring a relatively high supply voltage (e.g., VDD1), pins, routing, congestion, crosstalk, and large IC footprint. Thus, as illustrated, the buffer 485 may receive a supply voltage VDD2 that is substantially less than the supply voltage VDD1 required by a bandgap reference circuit (e.g., VDD2<VDD1). As an example, the supply voltage VDD2 may be the same as one used for digital circuitry or memory.

Figure 5:
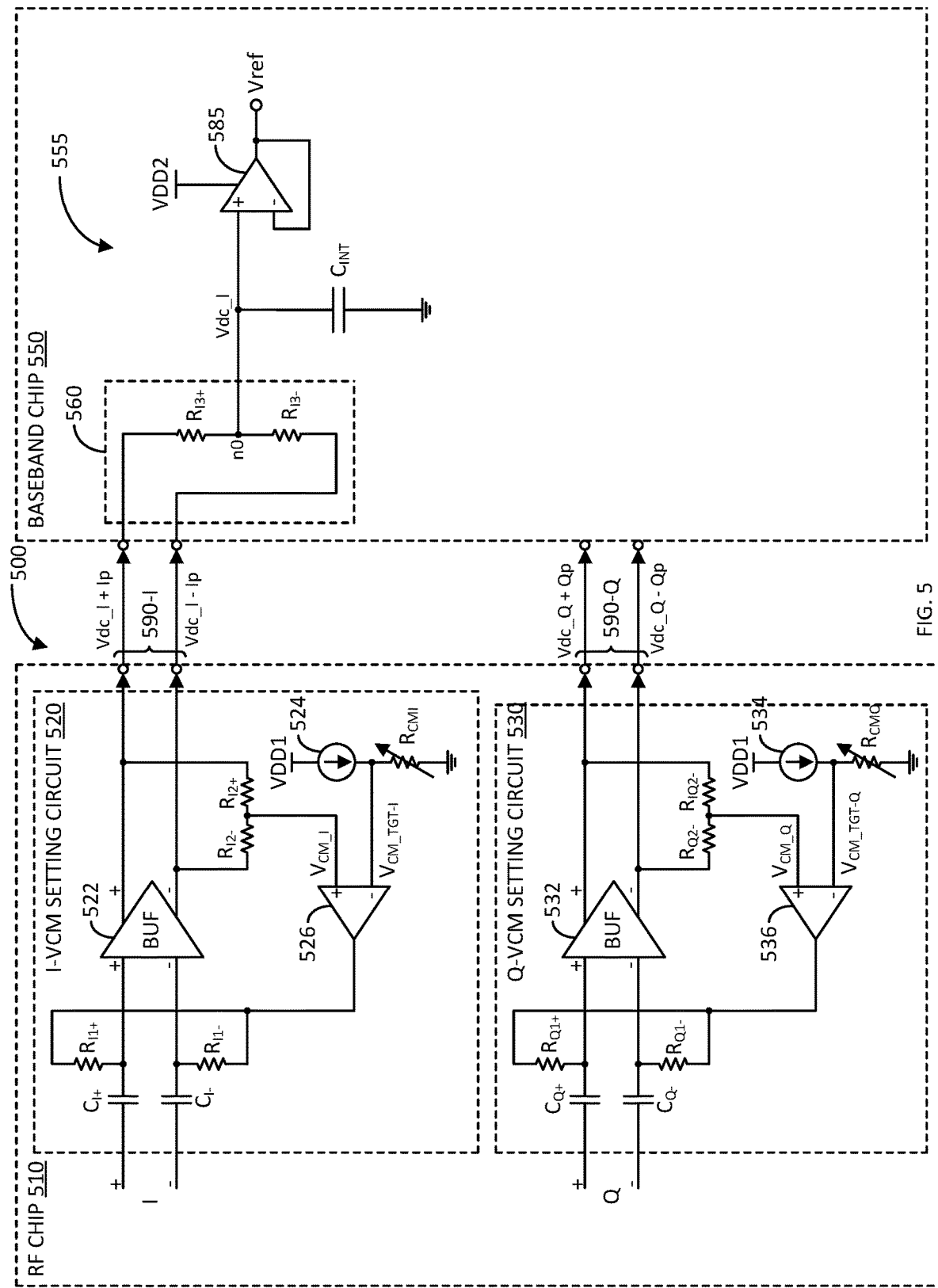
FIG. 5 illustrates a block diagram of another exemplary multiple-chip apparatus in accordance with another aspect of the disclosure.

FIG. 5 illustrates a block diagram of another exemplary multiple-chip apparatus 500 in accordance with another aspect of the disclosure. The apparatus 500 is a variation of apparatus 400, and includes many of the same elements as indicated by the same reference numbers with the exception that the most significant digit is a "5" instead of a "4". Those common elements have been described in detail in the description of apparatus 400. The apparatus 500 differs from apparatus 400 in that the baseband chip 550 includes a reference voltage generator 555 that generates a reference voltage based only on the I-differential data signal from the RF chip 510 instead of both the I- and Q-differential signals as in apparatus 400.

In particular, the reference voltage generator 555 includes a common mode voltage extracting circuit 560, an integrating capacitor $C_{INT}$, and a buffer 585. The common mode voltage extracting circuit 560 includes resistors $R_{I3+}$ and $R_{I3-}$ with respective first terminals configured to receive the I-output differential data signal Vdc_I±Ip from the RF chip 510 via differential data signal transmission lines 590-I that may be formed on and/or within a PCB upon which the RF chip 510 and the baseband chip 550 are mounted. The resistors $R_{I3+}$ and $R_{I3-}$, having substantially the same resistance, include respective second terminals coupled together at a node n0, and configured to produce the extracted common mode voltage Vdc_I of the I-output differential data signal Vdc_I±Ip.

The common mode voltage Vdc_I is applied across a shunt integrating capacitor $C_{INT}$ coupled between node n0 and ground. The integrating capacitor $C_{INT}$ low pass filters the common mode voltage Vdc_I to remove substantially all AC components from the voltage; thereby, resulting in a substantially constant DC voltage being applied to the positive input of the buffer 585. The buffer 585 buffers the DC voltage at its positive input to generate a substantially constant DC reference voltage Vref at its output.

Since the reference voltage Vref is based on the I-output differential data signal, which has a common mode voltage Vdc_I set by the bandgap reference voltage $V_{CM\_TGT-I}$, the reference voltage Vref has substantially the same stability with respect to temperature and supply voltage variation as the bandgap reference voltage. Thus, there is no need to provide a separate bandgap reference circuit in the baseband chip 550, which has the aforementioned drawbacks of requiring a relatively high supply voltage (e.g., VDD1), pins, routing, congestion, crosstalk, and large IC footprint. Thus, as illustrated, the buffer 585 may receive a supply voltage VDD2 that is substantially less than the supply voltage VDD1 required by a bandgap reference circuit (e.g., VDD2<VDD1).

Figure 6:
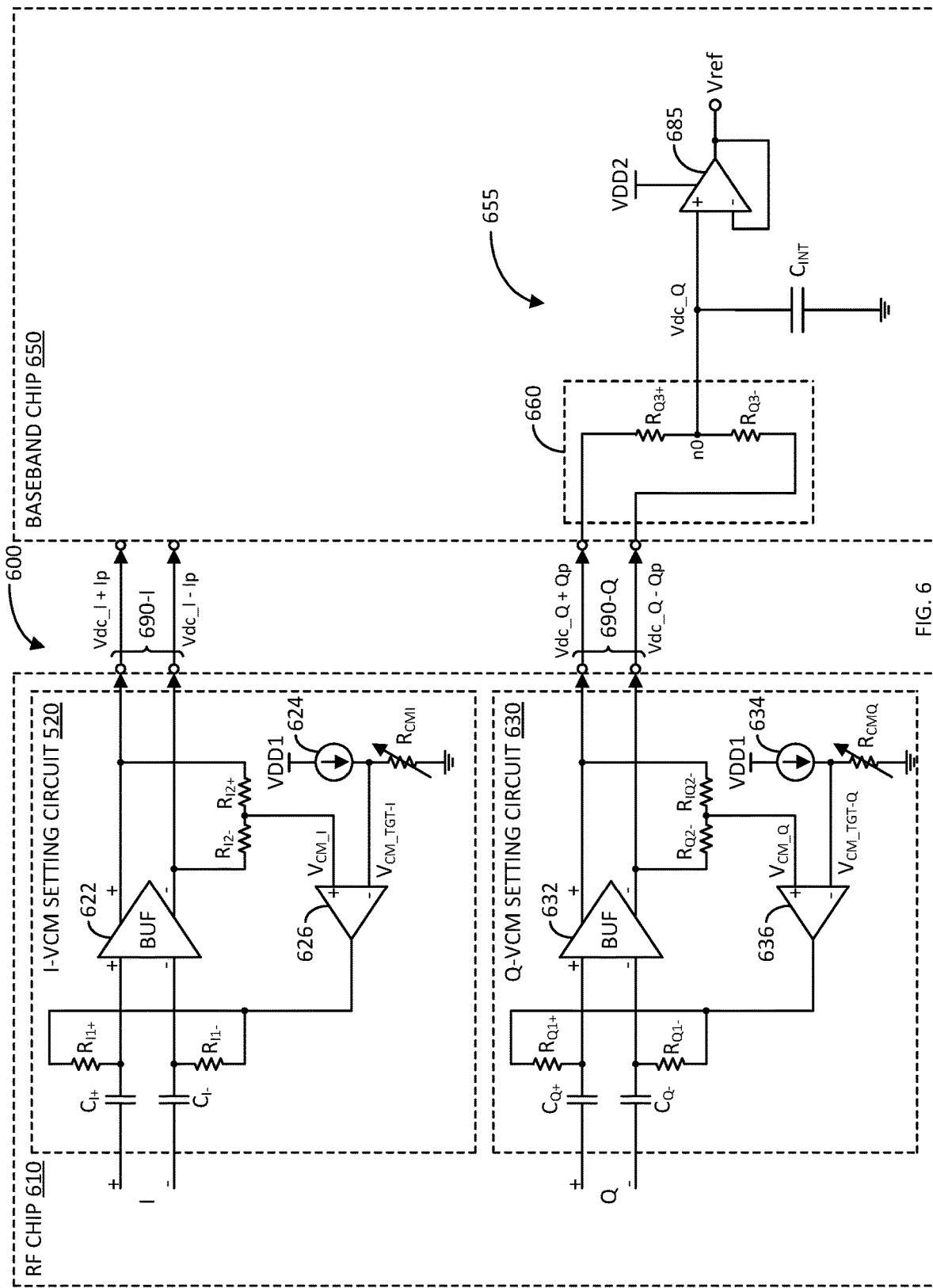
FIG. 6 illustrates a block diagram of yet another exemplary multiple-chip apparatus in accordance with another aspect of the disclosure.

FIG. 6 illustrates a block diagram of another exemplary multiple-chip apparatus 600 in accordance with another aspect of the disclosure. The apparatus 600 is a variation of apparatus 400, and includes many of the same elements as indicated by the same reference numbers with the exception that the most significant digit is a "6" instead of a "4". Those common elements have been described in detail in the description of apparatus 400. The apparatus 600 differs from apparatus 400 in that the baseband chip 650 includes a reference voltage generator 655 that generates a reference voltage based only on the Q-differential data signal from the RF chip 610 instead of both the I- and Q-differential signals as in apparatus 400.

In particular, the reference voltage generator 655 includes a common mode voltage extracting circuit 660, an integrating capacitor $C_{INT}$, and a buffer 685. The common mode voltage extracting circuit 660 includes resistors $R_{Q3+}$ and $R_{Q3-}$ with respective first terminals configured to receive the Q-output differential data signal Vdc_Q±Qp from the RF chip 610 via differential data signal transmission lines 690-Q that may be formed on and/or within a PCB upon which the RF chip 610 and the baseband chip 650 are mounted. The resistors $R_{Q3+}$ and $R_{Q3-}$, having substantially the same resistance, include respective second terminals coupled together at a node n0, and configured to produce the extracted common mode voltage Vdc_Q of the Q-output differential signal Vdc_Q±Qp.

The Q-signal common mode voltage Vdc_Q is applied across a shunt integrating capacitor $C_{INT}$ coupled between node n0 and ground. The integrating capacitor $C_{INT}$ low pass filters the common mode voltage Vdc_Q to remove substantially all AC components from the voltage; thereby, resulting in a substantially constant DC voltage being applied to the positive input of the buffer 685. The buffer 685 buffers the DC voltage at its positive input to generate a substantially constant DC reference voltage Vref at its output.

Since the reference voltage Vref is based on the Q-output differential data signal, which has a common mode voltage Vdc_Q set by the bandgap reference voltage $V_{CM\_TGT\_Q}$, the reference voltage Vref has substantially the same stability with respect to temperature and supply voltage variation as the bandgap reference voltage. Thus, there is no need to provide a separate bandgap reference circuit in the baseband chip 650, which has the aforementioned drawbacks of requiring a relatively high supply voltage (e.g., VDD1), pins, routing, congestion, crosstalk, and large IC footprint. Thus, as illustrated, the buffer 685 may use a supply voltage VDD2 that is substantially less than the supply voltage VDD1 required by a bandgap reference circuit (e.g., VDD2<VDD1).

Figure 7:
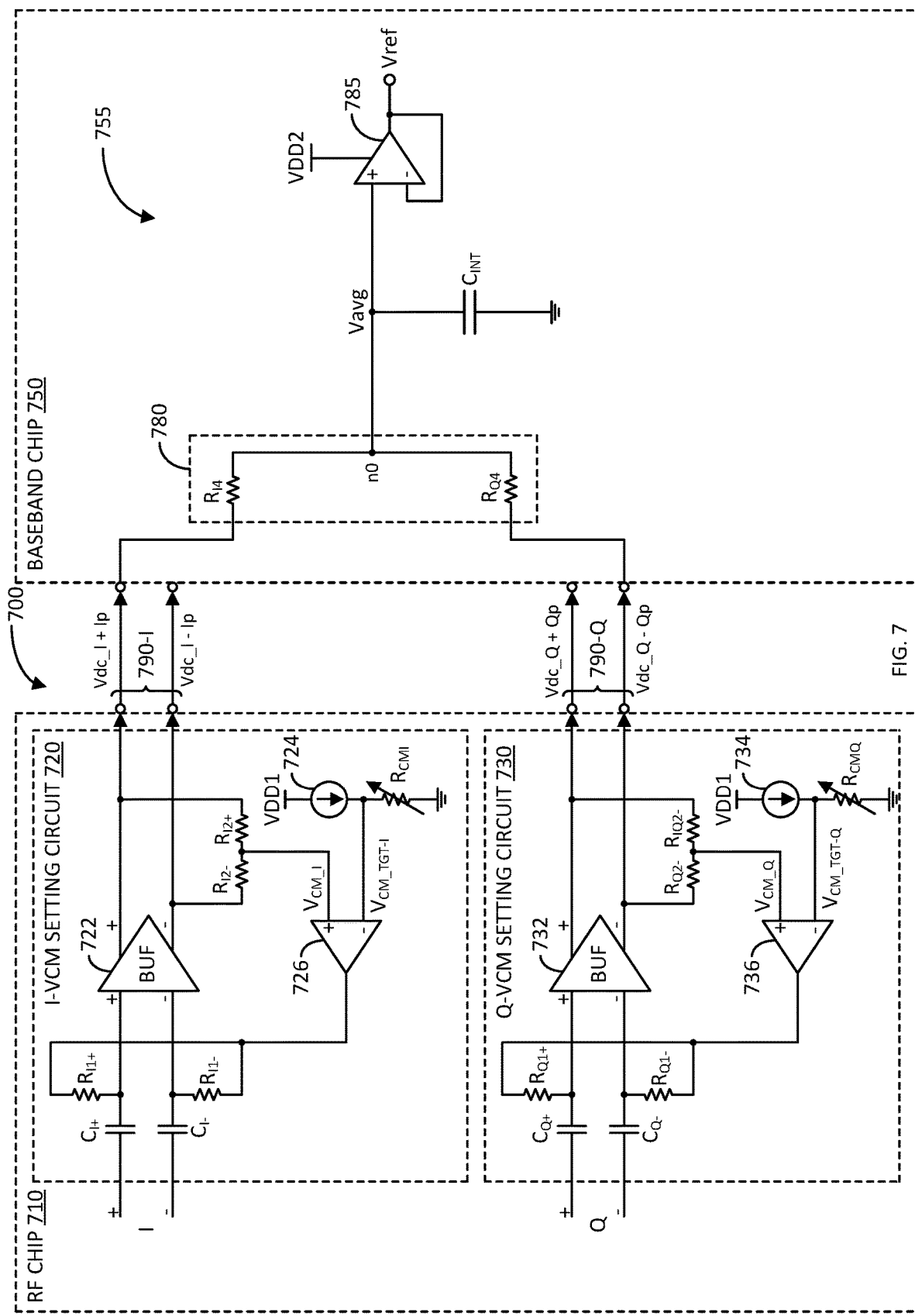
FIG. 7 illustrates a block diagram of still another exemplary multiple-chip apparatus in accordance with another aspect of the disclosure.

FIG. 7 illustrates a block diagram of another exemplary multiple-chip apparatus 700 in accordance with another aspect of the disclosure. The apparatus 700 is a variation of apparatus 400, and includes many of the same elements as indicated by the same reference numbers with the exception that the most significant digit is a "7" instead of a "4". Those common elements have been described in detail in the description of apparatus 400. The apparatus 700 differs from apparatus 400 in that the baseband chip 750 includes a reference voltage generator 755 that generates a reference voltage based on a single-ended (e.g., positive)-component of the I-differential data signal and a single-ended (e.g., negative)-component of the Q-differential data signal, both from the RF chip 710.

In particular, the reference voltage generator 755 includes a voltage averaging circuit 780, an integrating capacitor $C_{INT}$, and a buffer 785. The voltage averaging circuit 780 includes resistors $R_{I4}$ and $R_{Q4}$ with respective first terminals configured to receive the positive-component of the I-output differential data signal Vdc_I+Ip and the negative-component of the Q-output differential data signal Vdc_Q−Qp from the RF chip 710 via the positive-side of the I-data signal transmission line 790-I and the negative-side of the Q-data signal transmission line 790-Q; both of which may be formed on and/or within a PCB upon which the RF chip 710 and the baseband chip 750 are mounted. The resistors $R_{I4}$ and $R_{Q4}$, which may have substantially the same resistance, include respective second terminals coupled together at node n0, and configured to produce an average (Vavg) of the I-positive-component voltage Vdc_I+Ip and the Q-negative-component voltage Vdc_Q−Qp ((e.g., (Vdc_I+Ip+Vdc_Q−Qp)/2)).

The average voltage is applied across a shunt integrating capacitor $C_{INT}$ coupled between node n0 and ground. The integrating capacitor $C_{INT}$ low pass filters the average voltage to remove substantially all AC components from the voltage; thereby, resulting in a substantially constant DC voltage being applied to the positive input of the buffer 785. The buffer 785 buffers the DC voltage at its positive input to generate a substantially constant DC reference voltage Vref at its output.

Note that the average voltage is a function of Ip−Qp. Statistically, the Ip may have the same average value as the Qp over time. Accordingly, statistically the Ip and Qp may cancel each other over time; leaving the average voltage to be substantially the average of the common mode voltages Vdc_I and Vdc_Q of the I- and Q-differential data signals. Since the reference voltage Vref is based on the average of the common mode voltages of the I- and Q-output differential data signals, and these common mode voltages are based on bandgap reference voltages $V_{CM\_TGT\_I}$ and $V_{CM\_TGT\_Q}$, respectively, the reference voltage Vref has substantially the same stability with respect to temperature and supply voltage variation as the bandgap reference voltages.

Thus, there is no need to provide a separate bandgap reference circuit in the baseband chip 750, which has the aforementioned drawbacks of requiring a relatively high supply voltage (e.g., VDD1), pins, routing, congestion, crosstalk, and large IC footprint. Thus, as illustrated, the buffer 785 may use a supply voltage VDD2 that is substantially less than the supply voltage VDD1 required by a bandgap reference circuit (e.g., VDD2<VDD1).

Figure 8:
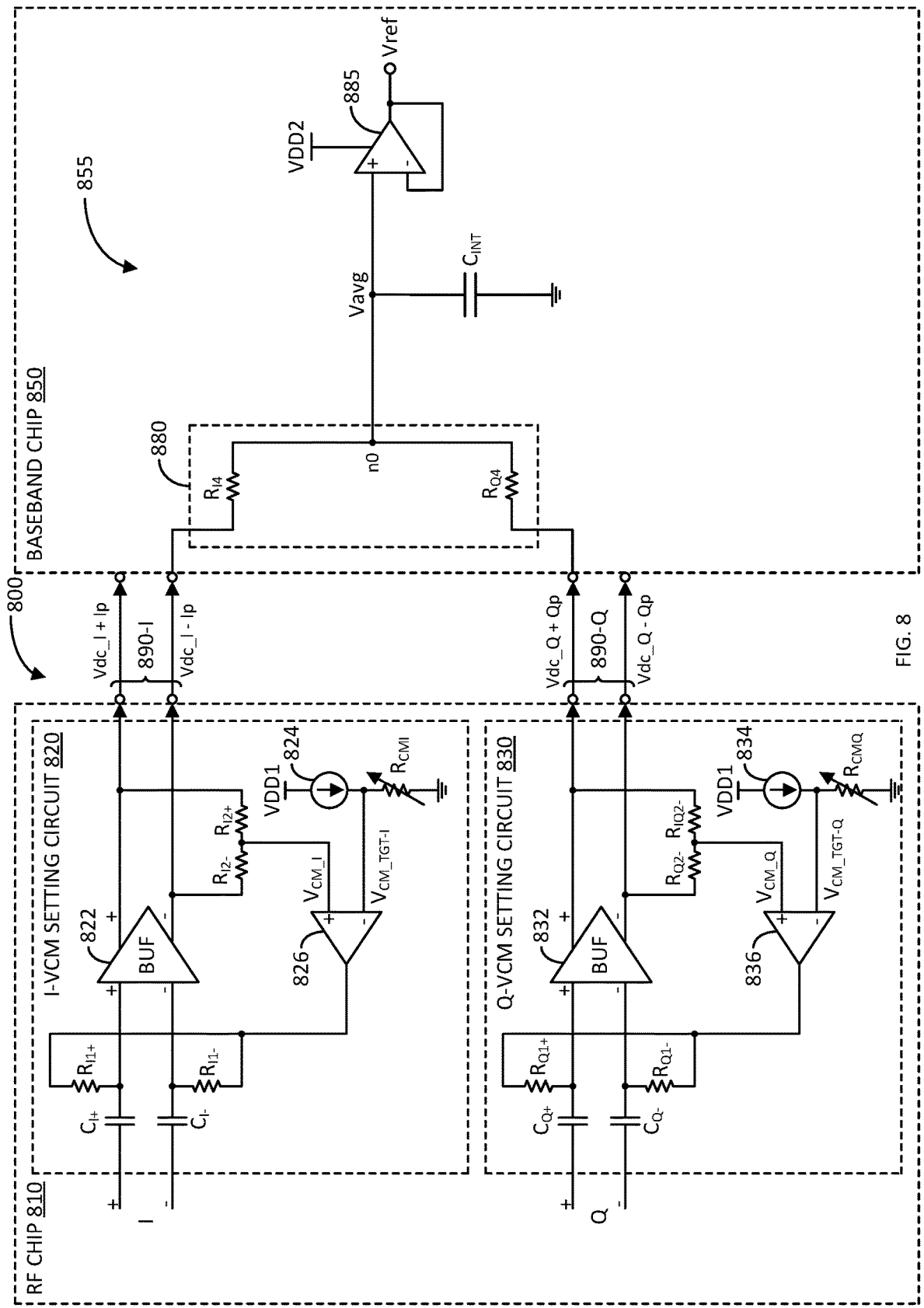
FIG. 8 illustrates a block diagram of an additional exemplary multiple-chip apparatus in accordance with another aspect of the disclosure.

FIG. 8 illustrates a block diagram of another exemplary multiple-chip apparatus 800 in accordance with another aspect of the disclosure. The apparatus 800 is a variation of apparatus 400, and includes many of the same elements as indicated by the same reference numbers with the exception that the most significant digit is a "8" instead of a "4". Those common elements have been described in detail in the description of apparatus 400. The apparatus 800 differs from apparatus 400 in that the baseband chip 850 includes a reference voltage generator 855 that generates a reference voltage based on a single-ended (e.g., negative)-component of the I-differential data signal from the RF chip 810 and a single-ended (e.g., positive)-component of the Q-differential data signal from the RF chip 810.

In particular, the reference voltage generator 855 includes an averaging circuit 880, an integrating capacitor $C_{INT}$, and a buffer 885. The averaging circuit 880 includes resistors $R_{I4}$ and $R_{Q4}$ with respective first terminals configured to receive the negative-component of the I-output differential data signal Vdc_I−Ip and the positive-component of the Q-output differential data signal Vdc_Q+Qp from the RF chip 810 via the negative-side of the I-data signal transmission line 890-I and the positive-side of the Q-data signal transmission line 890-Q; both of which may be formed on and/or within a PCB upon which the RF chip 810 and the baseband chip 850 are mounted. The resistors $R_{I4}$ and $R_{Q4}$, which may have substantially the same resistance, include respective second terminals coupled together at node n0, and configured to produce an average (Vavg) of the I-negative-component voltage Vdc_I−Ip and the Q-positive-component voltage Vdc_Q+Qp ((e.g., (Vdc_I−Ip+Vdc_Q+Qp)/2)).

The average voltage is applied across a shunt integrating capacitor $C_{INT}$ coupled between node n0 and ground. The integrating capacitor $C_{INT}$ low pass filters the average voltage to remove substantially all AC components from the voltage; thereby, resulting in a substantially constant DC voltage being applied to the positive input of the buffer 885. The buffer 885 buffers the DC voltage at its positive input to generate a substantially constant DC reference voltage Vref at its output.

Note that the average voltage is a function of the Qp–Ip. Statistically, the Qp may have the same average value as the Qp over time. Accordingly, statistically the Ip and Qp may cancel each other over time; leaving the average voltage to be substantially the average of the common mode voltages Vdc_I and Vdc_Q of the I- and Q-differential data signals. Since the reference voltage Vref is based on the average of the common mode voltages of the I- and Q-output differential signals, and these common mode voltages are based on bandgap reference voltages $V_{CM\_TGT\_I}$ and $V_{CM\_TGT\_Q}$, respectively, the reference voltage Vref has substantially the same stability with respect to temperature and supply voltage variation as the bandgap reference voltages.

Thus, there is no need to provide a separate bandgap reference circuit in the baseband chip 850, which has the aforementioned drawbacks of requiring a relatively high supply voltage (e.g., VDD1), pins, routing, congestion, crosstalk, and large IC footprint. Thus, as illustrated, the buffer 885 may use a supply voltage VDD2 that is substantially less than the supply voltage VDD1 required by a bandgap reference circuit (e.g., VDD2<VDD1).

Figure 9:
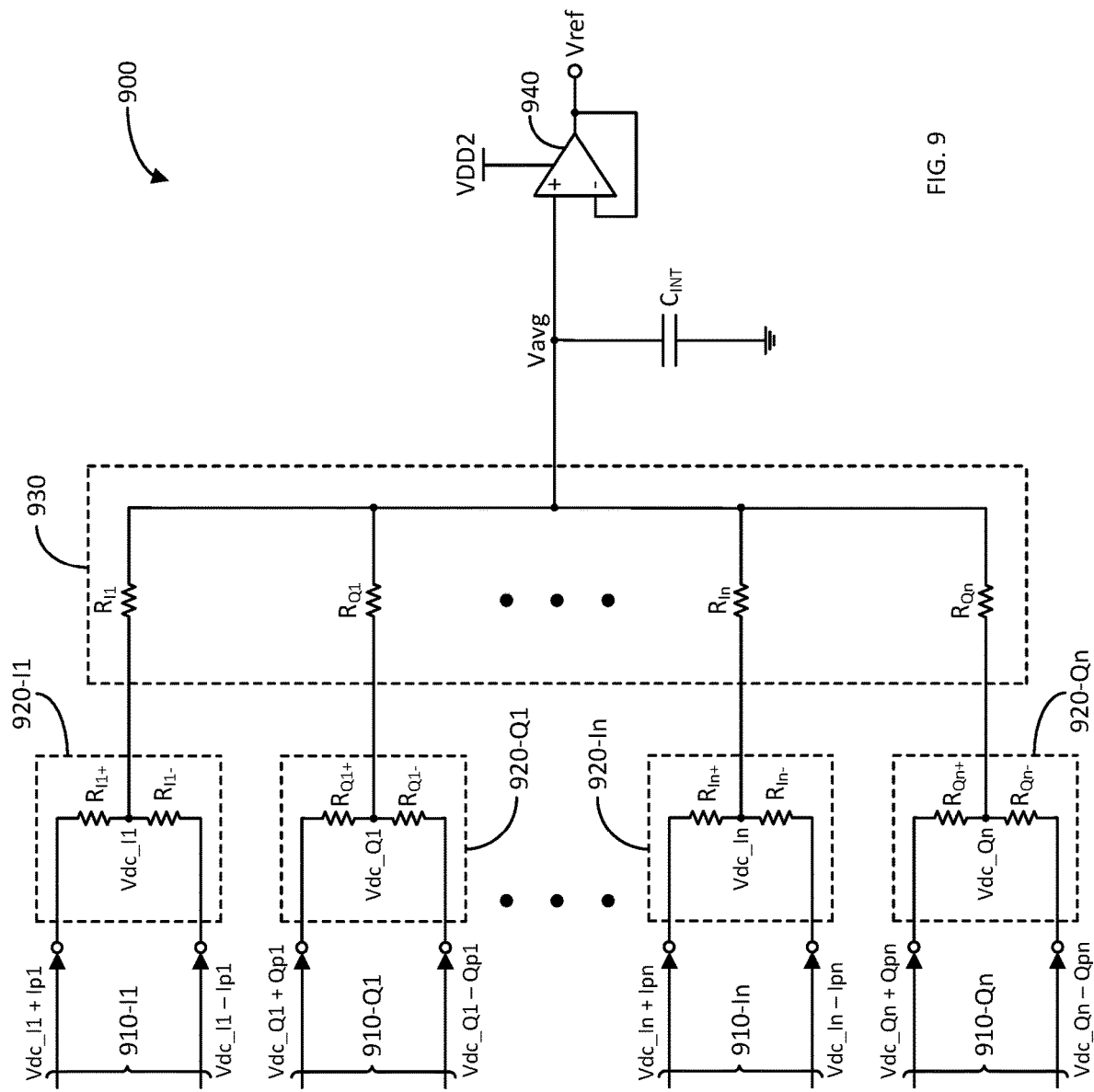
FIG. 9 illustrates a schematic diagram of an exemplary reference voltage generator in accordance with another aspect of the disclosure.

FIG. 9 illustrates a schematic diagram of an exemplary reference voltage generator 900 in accordance with another aspect of the disclosure. In the previous examples, the reference voltage generators generated a reference voltage Vref based on one or two input differential signals (e.g., an I-differential signal and/or a Q-differential signal). It shall be understood that a reference voltage generator as described herein may generate a reference voltage based on more than two input differential signals. Accordingly, reference voltage generator 900 is an example of a reference voltage generator that generates a reference voltage based on integer "n" number of input differential signals, where n is one or more.

In particular, the reference voltage generator 900 receives a set of I- and Q-differential signals Vdc_I1±Ip1/Vdc_Q1±Qp1 to Vdc_In ±Ipn/Vdc_Qn±Qpn via a set of differential signal transmission lines 910-I1/910-Q1 to 910-In/910-Qn, respectively. As an example, in the case n=2, the differential signal Vdc_I1±Ip1/Vdc_Q1±Qp1 may pertain to a primary channel, and the differential signal Vdc_I2±Ip2/Vdc_Q2±Qp2 may pertain to a diversity channel.

The reference voltage generator 900 includes a set of common mode voltage extracting circuits 920-I1/920-Q1 to 920-In/920-Qn configured to extract the common mode voltages Vdc_I1/Vdc_Q1 to Vdc_In/Vdc_Qn from the set of differential signals Vdc_I1±Ip1/Vdc_Q1±Qp1 to Vdc_In ±Ipn/Vdc_Qn±Qpn, respectively.

As an example, the common mode voltage extracting circuit 920-I1 includes resistors $R_{I1+}$ and $R_{I1-}$ with respective first terminals coupled to the positive- and negative-sides of the differential signal transmission lines 910-I1, respectively. The resistors $R_{I1+}$ and $R_{I1-}$ include respective second terminals coupled together at a common node at which the common mode voltage Vdc_I1 is produced. The resistors $R_{I1+}$ and $R_{I1-}$ may be configured with substantially the same resistance.

Similarly, the common mode voltage extracting circuit 920-Q1 includes resistors $R_{Q1+}$ and $R_{Q1-}$ with respective first terminals coupled to the positive- and negative-sides of the differential signal transmission lines 910-Q1, respectively. The resistors $R_{Q1+}$ and $R_{Q1-}$ include respective second terminals coupled together at a common node at which the common mode voltage Vdc_Q1 is produced. The resistors $R_{Q1+}$ and $R_{Q1-}$ may be configured with substantially the same resistance.

The common mode voltage extracting circuit 920-In includes resistors $R_{In+}$ and $R_{In-}$ with respective first terminals coupled to the positive- and negative-sides of the differential signal transmission lines 9104n, respectively. The resistors $R_{In+}$ and $R_{In-}$ include respective second terminals coupled together at a common node at which the common mode voltage Vdc_In is produced. The resistors $R_{In+}$ and $R_{IN-}$ may be configured with substantially the same resistance.

Similarly, the common mode voltage extracting circuit 920-Qn includes resistors $R_{Qn+}$ and $R_{Qn-}$ with respective first terminals coupled to the positive- and negative-sides of the differential signal transmission lines 910-Qn, respectively. The resistors $R_{Qn+}$ and $R_{Qn-}$ include respective second terminals coupled together at a common node at which the common mode voltage Vdc_Qn is produced. The resistors $R_{Qn+}$ and $R_{Qn-}$ may be configured with substantially the same resistance.

If n is greater than two (2), then the common mode voltage extracting circuit(s) 920-I2/920-Q2 to 920-I(n−1)/920-Q(n−1) between 920-I1/920-Q1 and 920-In/920-Qn may be configured similar to any of the common mode voltage extracting circuit previously described.

The reference voltage generator 900 further includes a voltage averaging circuit 930 configured to generate an average or weighted-average voltages of the common mode voltages Vdc_I1/Vdc_Q1 to Vdc_In/Vdc_Qn, respectively. The voltage averaging circuit 930 includes a set of resistors $R_{I1}/R_{Q1}$ to $R_{In}/R_{Qn}$ with respective first terminals coupled to the common nodes of the common mode voltage extracting circuits 920-I1/920-Q1 to 920-In/920-Qn, respectively. The set of resistors $R_{I1}/R_{Q1}$ to $R_{In}/R_{Qn}$ include respective second terminals coupled together at a common node at which an average voltage Vavg is produced. If the set of resistors $R_{I1}/R_{Q1}$ to $R_{In}/R_{Qn}$ have substantially the same resistance, then the voltage Vavg is a simple average. If the set of resistors $R_{I1}/R_{Q1}$ to $R_{In}/R_{Qn}$ have different resistances, then the voltage Vavg is a weighted-average.

The average voltage Vavg is applied across an integrating capacitor $C_{INT}$. The integrating capacitor $C_{INT}$ low pass filters the average voltage Vavg to remove substantially all AC components of from the voltage. This produces a substantially constant DC voltage at a positive input of a buffer 940. Accordingly, the buffer 940 generates a substantially constant DC reference voltage Vref with a low output impedance to allow one or more circuit blocks to draw current from the buffer 940 without substantially affecting the reference voltage Vref. As discussed with previous implementations, the buffer 940 may receive a supply voltage VDD2 that is less than a supply voltage VDD1 that is required by a bandgap circuit.

Figure 10:
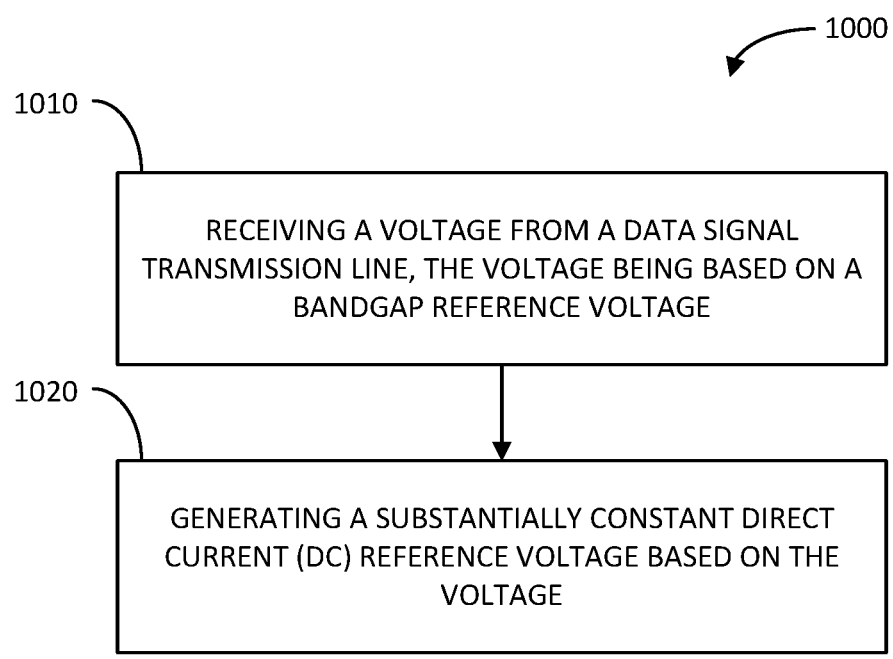
FIG. 10 illustrates a flow diagram of an exemplary method of generating a reference voltage in accordance with another aspect of the disclosure.

FIG. 10 illustrates a flow diagram of an exemplary method 1000 of generating a substantially constant DC reference voltage in accordance with another aspect of the disclosure.

The method 1000 includes receiving a voltage from a data signal transmission line, the voltage being based on a bandgap reference voltage (block 1010). An example of a means for receiving a voltage from a data signal transmission line includes inputs to the reference voltage generators 370, 455, 555, 655, 765, 865, and 900 previously discussed.

The method 1000 further includes generating a substantially constant direct current (DC) reference voltage based on the voltage (block 1020). A means for generating a substantially constant direct current (DC) reference voltage based on the voltage includes the reference voltage generators 370, 455, 555, 655, 765, 865, and 900 previously discussed.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a reference voltage generator configured to generate a substantially constant direct current (DC) reference voltage, the reference voltage generator coupled to a plurality of data signal transmission lines, the plurality of data signal transmission lines include
   a first differential transmission line configured to transmit a first differential data signal; and
   a second differential transmission line configured to transmit a second differential data signal, wherein the reference voltage generator comprises a voltage averaging circuit configured to generate an average voltage based on a first voltage on a positive-side of the first differential transmission line and a second voltage on a negative-side of the second differential transmission line, wherein the average voltage is not based on voltages on a negative-side of the first differential transmission line and a positive-side of the second differential transmission line, respectively, and wherein the substantially constant DC reference voltage is based on the average voltage.

2. The apparatus of claim 1, wherein the first voltage comprises a first common mode voltage on the first differential transmission line.

3. The apparatus of claim 2, wherein the second voltage comprises a second common mode voltage on the second differential transmission line.

4. The apparatus of claim 3, wherein the voltage averaging circuit comprises:
   a first resistor having a first end and a second end, the first end coupled to the positive side of the first differential transmission line; and
   a second resistor having a first end and a second end, the first end coupled to the negative-side of the second differential transmission line, the second end of the second resistor coupled to the second end of the first resistor to generate the average voltage.

5. The apparatus of claim 4, wherein the reference voltage generator further comprises a filter configured to low pass filter the average voltage to generate a substantially constant DC voltage.

6. The apparatus of claim 5, wherein the low pass filter comprises a capacitor coupled between the second end of the first resistor and ground.

7. The apparatus of claim 5, wherein the reference voltage generator further comprises a buffer configured to generate the substantially constant DC reference voltage based on the average voltage.

8. The apparatus of claim 1, wherein the first differential transmission line is configured to transmit an I-differential data signal and the first differential transmission line is configured to transmit a Q-differential data signal.

9. A method, comprising:
   receiving first data from a first differential transmission line;
   receiving second data from a second differential transmission line;
   generating an average voltage based on a first voltage on a positive-side of the first differential transmission line and a second voltage on a negative-side of the second differential transmission line, wherein the average voltage is not based on voltages on a negative-side of the first differential transmission line and a positive-side of the second differential transmission line, respectively; and
   generating a substantially constant direct current (DC) reference voltage based on the average voltage.

10. The method of claim 9, wherein the first voltage comprises a first common mode voltage on the first differential transmission line.

11. The method of claim 10, wherein the second voltage comprises a second common mode voltage on the second differential transmission line.

12. The method of claim 11, further comprising low pass filtering the average voltage to generate a substantially constant DC voltage.

13. The method of claim 9, wherein the first differential transmission line is configured to transmit an I-differential data signal and the first differential transmission line is configured to transmit a Q-differential data signal.

* * * * *